(12) United States Patent
Azumai

(10) Patent No.: US 7,964,968 B2
(45) Date of Patent: Jun. 21, 2011

(54) SEMICONDUCTOR INTEGRATED CIRCUIT

(75) Inventor: Ryo Azumai, Osaka (JP)

(73) Assignee: Panasonic Corporation, Osaka (JP)

( * ) Notice: Subject to any disclaimer, the term of this patent is extended or adjusted under 35 U.S.C. 154(b) by 304 days.

(21) Appl. No.: 12/336,132

(22) Filed: Dec. 16, 2008

(65) Prior Publication Data

US 2009/0166894 A1    Jul. 2, 2009

(30) Foreign Application Priority Data

Dec. 28, 2007    (JP) .................................. 2007-339750

(51) Int. Cl.
*H01L 23/48* (2006.01)
(52) U.S. Cl. ................................ 257/758; 257/E23.151
(58) Field of Classification Search .................. 257/758, 257/E23.151
See application file for complete search history.

(56) References Cited

U.S. PATENT DOCUMENTS

| | | | |
|---|---|---|---|
| 5,742,085 A | 4/1998 | Yu | |
| 5,811,856 A | 9/1998 | Lee | |
| 6,163,056 A | 12/2000 | Maekawa | |
| 6,215,157 B1 | 4/2001 | Fukuda | |
| 6,750,517 B1 * | 6/2004 | Ker et al. | 257/355 |
| 7,245,016 B2 * | 7/2007 | Chang | 257/758 |
| 7,291,918 B2 * | 11/2007 | Tsai et al. | 257/758 |
| 2001/0045670 A1 | 11/2001 | Nojiri | |
| 2006/0284256 A1 | 12/2006 | Wu et al. | |

FOREIGN PATENT DOCUMENTS

JP    2001-339047    12/2001

* cited by examiner

*Primary Examiner* — Lex Malsawma
(74) *Attorney, Agent, or Firm* — McDermott Will & Emery LLP

(57) ABSTRACT

The present invention reduces the congestion of signal wires around an ESD protection circuit resulting from the presence of a connecting wire above the ESD protection circuit. The connecting wire connected to the ESD protection circuit extends in the same direction as a wire preferential direction of a corresponding wiring layer. Therefore, a signal wire extending in the lateral direction may be formed in the wiring layer in which the connecting wire extends in the lateral direction and a signal wire extending in the longitudinal direction may be formed in the wiring layer in which the connecting wire extends in the longitudinal direction. This makes it possible to arrange the signal wire to extend in both of the lateral and longitudinal directions above the ESD protection circuit irrespective of the presence of the connecting wire.

19 Claims, 9 Drawing Sheets

SECTION ALONG LINE a-a'

SECTION ALONG LINE b-b'

SECTION ALONG LINE a-a'

SECTION ALONG LINE b-b'

SECTION ALONG LINE a-a'

SECTION ALONG LINE b-b'

SECTION ALONG LINE a-a'

SECTION ALONG LINE b-b'

111 INTERNAL LOGIC REGION    110
112 POWER SUPPLY PAD

116 INTERNAL LOGIC REGION    115
117 POWER SUPPLY PAD

SECTION ALONG LINE a-a'

SECTION ALONG LINE b-b'

SEMICONDUCTOR INTEGRATED CIRCUIT

CROSS-REFERENCE TO RELATED APPLICATION

This non-provisional application claims priority under 35 U.S.C. §119(a) of Japanese Patent Application No. 2007-339750 filed in Japan on Dec. 28, 2007, the entire contents of which are hereby incorporated by reference.

BACKGROUND OF THE INVENTION

1. Field of the Invention

The present invention relates to a layout of a semiconductor integrated circuit including an ESD (electro-static discharge) protection circuit.

2. Description of Related Art

In semiconductor integrated circuits of recent years, an ESD protection circuit is provided between a signal input terminal and a power supply terminal or between power supply terminals to prevent electrostatic breakdown caused by externally applied static electricity.

FIGS. 8A to 8C show a conventional ESD protection circuit. FIG. 8A is a plan view, FIG. 8B is a sectional view taken along the line a-a' and FIG. 8C is a sectional view taken along the line b-b'. The ESD protection circuit 50 shown in FIGS. 8A to 8C is a MOS protection circuit of a multifinger structure. Reference numerals 51, 52 and 53 denote a gate, a source and a drain of the ESD protection circuit 50, respectively.

Connecting wires 41, 42, 43 and 44 are arranged above the ESD protection circuit 50 and connected to the ESD protection circuit 50. The connecting wires 41, 42, 43 and 44 are formed in first, second, third and fourth metal layers, respectively, and extend along the extending direction of the source 52 and the drain 53 of the ESD protection circuit 50 (a lateral direction in FIG. 8A). Reference numerals 45 and 46 denote wires arranged between the connecting wires 41 to 44 and a pad. The wires 45 are formed in the fourth metal layer and the wire 46 is formed in a fifth metal layer.

(Patent Literature 1) Publication of Japanese Patent Application No. 2001-339047

In the conventional ESD protection circuit, the connecting wires 41 to 44 formed in the corresponding metal layers and connected to the ESD protection circuit 50 extend in the same direction as the extending direction of the source 52 and the drain 53 of the ESD protection circuit 50. Therefore, a signal wire extending in the same direction as the extending direction of the connecting wires (e.g., a signal wire 48 shown in FIG. 8A) may be arranged to run above the ESD protection circuit. However, a signal wire extending in the direction different from the extending direction of the connecting wires (e.g., a signal wire 47 shown in FIG. 8B) cannot be arranged to run above the ESD protection circuit because the connecting wires hinder the extension of the signal wire. Accordingly, the space above the ESD protection circuit cannot be freely used as a signal wire region and the signal wires have to be routed not to run above the ESD protection circuit region.

Under the circumstances, the signal wires are congested around the ESD protection circuit as shown in FIG. 9. This may bring about degradation of signal characteristics and increase of a chip area. FIG. 9 shows the ESD protection circuit and signal wires arranged around the ESD protection circuit. Referring to FIG. 9, a wire preferential direction of signal wires in an upper layer is a lateral direction, while that of signal wires in a lower layer is a longitudinal direction. Although the signal wires in the upper layer include longitudinally extending wires such as wires A, their wire preferential direction is considered as the lateral direction since most of the signal wires in the upper layer extend in the lateral direction.

SUMMARY OF THE INVENTION

With respect to a semiconductor integrated circuit having an ESD protection circuit, the present invention intends to reduce the congestion of signal wires around the ESD protection circuit resulting from the presence of connecting wires above the ESD protection circuit.

A semiconductor integrated circuit having an ESD protection circuit according to the present invention includes: a connecting wire formed above the ESD protection circuit and connected to the ESD protection circuit; and a signal wire running above the ESD protection circuit, wherein the connecting wire includes a wire formed in a first wiring layer in which a wire preferential direction is a lateral direction and a wire formed in a second wiring layer in which a wire preferential direction is a longitudinal direction, each of the wires extending in the same direction as the wire preferential direction of the corresponding wiring layer, and the signal wire includes a wire extending in the lateral direction in the first wiring layer and a wire extending in the longitudinal direction in the second wiring layer.

According to this invention, the connecting wires connected to the ESD protection circuit are formed in the first wiring layer in which the wire preferential direction is the lateral direction and the second wiring layer in which the wire preferential direction is the longitudinal direction, respectively, and each of the connecting wires extends in the same direction as the wire preferential direction of the corresponding wiring layer. Since the connecting wire extends in the lateral direction in the first wiring layer, the signal wire may be arranged to extend in the lateral direction. Further, since the connecting wire extends in the longitudinal direction in the second wiring layer, the signal wire may be arranged to extend in the longitudinal direction. This makes it possible to arrange the signal wires to extend in both of the lateral and longitudinal directions above the ESD protection circuit irrespective of the presence of the connecting wires.

Another semiconductor integrated circuit having the ESD protection circuit according to the present invention includes: a connecting wire formed above the ESD protection circuit and connected to the ESD protection circuit, wherein the connecting wire is formed in at least one wiring layer and is in the form of an array including a plurality of wire segments arranged at intervals in an array pattern so that wires other than the connecting wire formed in the at least one wiring layer are able to extend between the wire segments in lateral and longitudinal directions.

According to this invention, the connecting wire connected to the ESD protection circuit is formed in at least one wiring layer and is in the form of an array including a plurality of wire segments arranged at intervals in an array pattern so that wires other than the connecting wire are able to extend between the wire segments in the lateral and longitudinal directions. Therefore, in the wiring layer in which the array-shaped connecting wire has been formed, signal wires may be arranged to extend in both of the lateral and longitudinal directions. This makes it possible to arrange the signal wires to extend in both of the lateral and longitudinal directions above the ESD protection circuit irrespective of the presence of the connecting wires.

Thus, the present invention makes it possible to arrange the signal wires to extend in both of the lateral and longitudinal directions above the ESD protection circuit. Therefore, the congestion of the signal wires around the ESD protection circuit is reduced.

DETAILED DESCRIPTION OF THE INVENTION

Hereinafter, embodiments of the present invention are described with reference to the drawings.

Embodiment 1

Figure 1A:
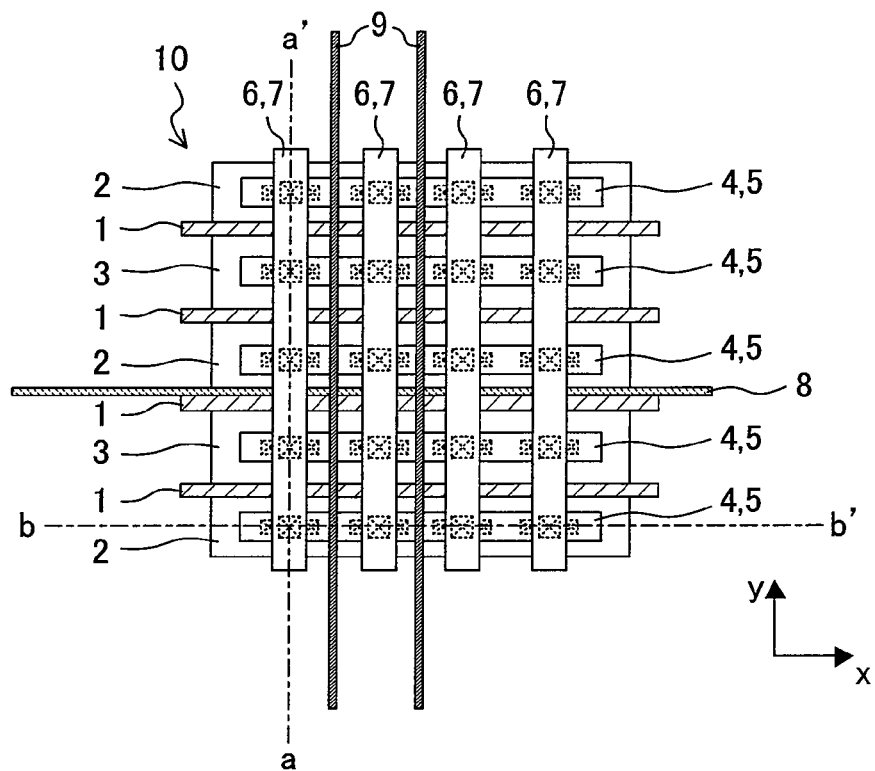
FIGS. 1A to 1C are views illustrating the structure of an ESD protection circuit in a semiconductor integrated circuit according to Embodiment 1 of the present invention.
Figure 1B:
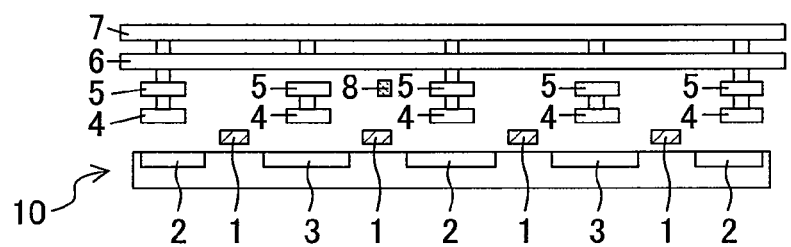
Figure 1C:
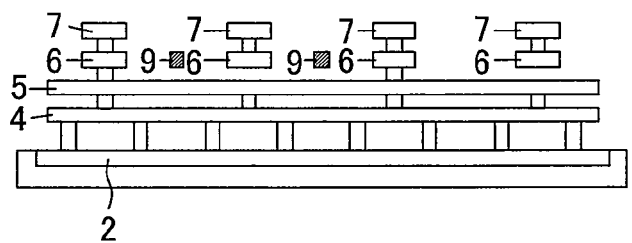

FIGS. 1A to 1C illustrate the structure of an ESD protection circuit in a semiconductor integrated circuit according to Embodiment 1 of the present invention. FIG. 1A is a plan view, FIG. 1B is a sectional view taken along the line a-a' and FIG. 1C is a section taken along the line b-b'. In the present embodiment and the following embodiments, the ESD protection circuit is a MOS protection circuit. In FIGS. 1A to 1C, an ESD protection circuit 10 is a MOS protection circuit of a multifinger structure, in which reference numerals 1, 2 and 3 denote a gate, a source and a drain of the ESD protection circuit 10, respectively.

Reference numerals 4, 5, 6 and 7 denote connecting wires formed above the ESD protection circuit 10 and connected to the ESD protection circuit 10. The connecting wires 4, 5, 6 and 7 are formed in first, second, third and fourth metal layers, respectively. Reference numerals 8 and 9 denote signal wires arranged to run above the ESD protection circuit 10.

The connecting wire 5 extends in the same direction as a wire preferential direction of the second metal layer serving as a first wiring layer, i.e., the x direction (a lateral direction). The connecting wire 6 extends in the same direction as a wire preferential direction of the third metal layer serving as a second wiring layer, i.e., the y direction (a longitudinal direction). The signal wire 8 is formed in the second metal layer and extends in the x direction in the same manner as the connecting wire 5. The signal wire 9 is formed in the third metal layer and extends in the y direction in the same manner as the connecting wire 6. In actuality, some wires in each wiring layer may extend in a direction different from the wire preferential direction, but most of the wires extend in a direction corresponding to the wire preferential direction of the wiring layer in which the wires are formed.

The connecting wires are formed in the wiring layer in which the wire preferential direction is the lateral direction and the wiring layer in which the wire preferential direction is the longitudinal direction, respectively, and each of the connecting wires is extends in the same direction as the wire preferential direction of the corresponding wiring layer. Accordingly, the signal wires may be arranged to run above the ESD protection circuit without any hindrance by the connecting wires. More specifically, the signal wires may be arranged to extend in both of the lateral and longitudinal directions above the ESD protection circuit. This makes it possible to use the space above the ESD protection circuit as a signal wire region with efficiency. Thus, the congestion of the signal wires around the ESD protection circuit is prevented.

Embodiment 2

Figure 2A:
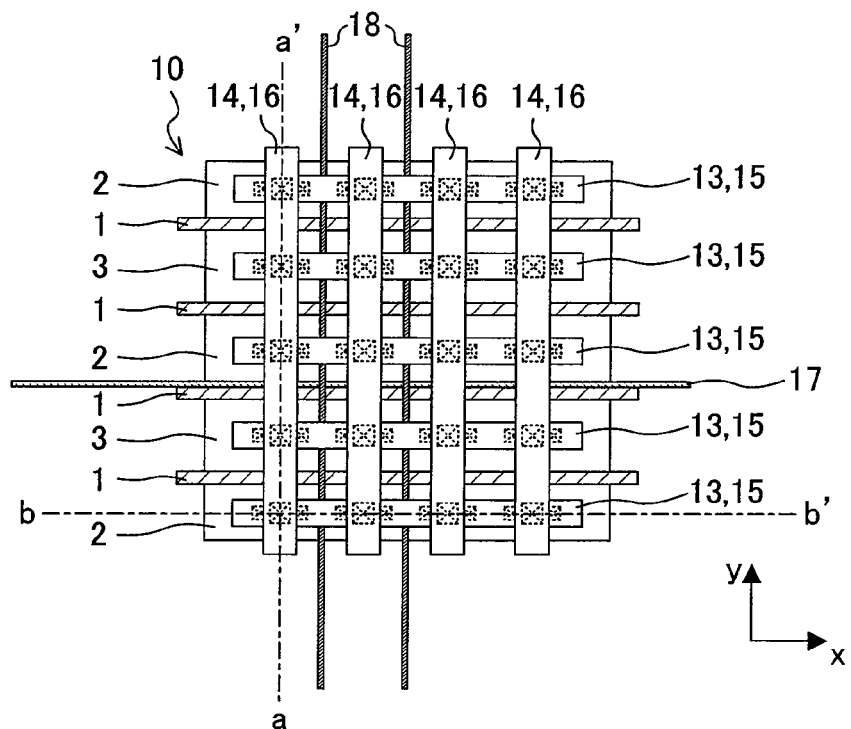
FIGS. 2A to 2C are views illustrating the structure of an ESD protection circuit in a semiconductor integrated circuit according to Embodiment 2 of the present invention.
Figure 2B:
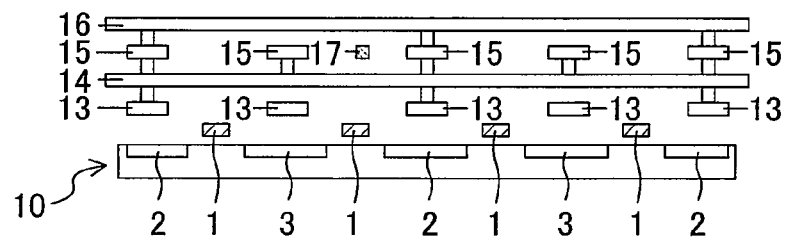
Figure 2C:
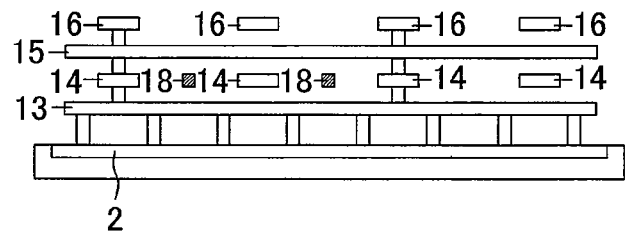

FIGS. 2A to 2C illustrate the structure of an ESD protection circuit in a semiconductor integrated circuit according to Embodiment 2 of the present invention. FIG. 2A is a plan view, FIG. 2B is a sectional view taken along the line a-a' and FIG. 2C is a sectional view taken along the line b-b'. The structure shown in FIGS. 2A to 2C includes the same ESD protection circuit 10 as that shown in FIG. 1.

In FIGS. 2A to 2C, reference numerals 13, 14, 15 and 16 denote connecting wires formed above the ESD protection circuit 10 and connected to the ESD protection circuit 10. The connecting wires 13, 14, 15 and 16 are formed in first, second, third and fourth metal layers, respectively. Reference numerals 17 and 18 denote signal wires arranged to run above the ESD protection circuit 10.

Each of the connecting wires 13, 14, 15 and 16 extends in the same direction as a wire preferential direction of the corresponding wiring layer. More specifically, the connecting wires 13 and 15 extend in the same directions as the wire preferential directions of the first and third metal layers, respectively, i.e., the x direction. The connecting wires 14 and 16 extend in the same directions as the wire preferential directions of the second and fourth metal layers, respectively, i.e., the y direction. The signal wire 17 is formed in the third metal layer serving as a first wiring layer and extends in the x direction in the same manner as the connecting wire 15. The signal wire 18 is formed in the second metal layer serving as a second wiring layer and extends in the y direction in the same manner as the connecting wire 14. In addition, a signal wire may be formed in the first metal layer to extend in the x direction in the same manner as the connecting wire 13. A signal wire may be formed in the fourth metal layer to extend in the y direction in the same manner as the connecting wire 16.

Each of the connecting wires formed in the wiring layers is arranged to extend in the same direction as the wire preferential direction in the corresponding wiring layer. Therefore, the signal wires are arranged to run above the ESD protection circuit without any hindrance by the connecting wires. More specifically, the signal wires are arranged to extend in both of the lateral and longitudinal directions above the ESD protection circuit. Further, in any of the wiring layers in which the connecting wires are formed, respectively, the signal wire may be arranged to extend in the same direction as the connecting wire. This makes it possible to use the space above the ESD protection circuit as a signal wire region with efficiency.

Thus, the congestion of the signal wires around the ESD protection circuit is prevented.

Embodiment 3

Figure 3A:
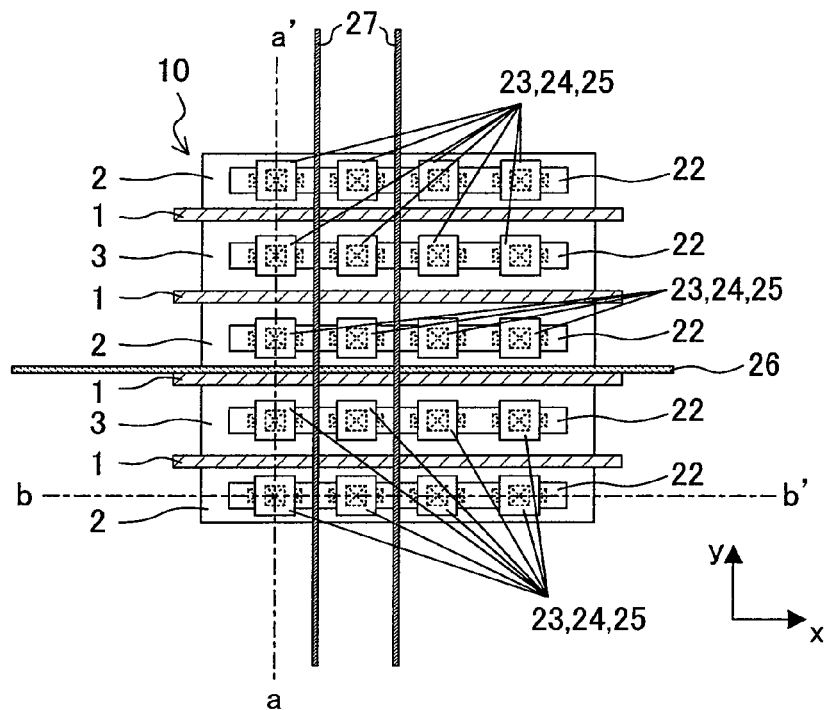
FIGS. 3A to 3C are views illustrating the structure of an ESD protection circuit in a semiconductor integrated circuit according to Embodiment 3 of the present invention.
Figure 3B:
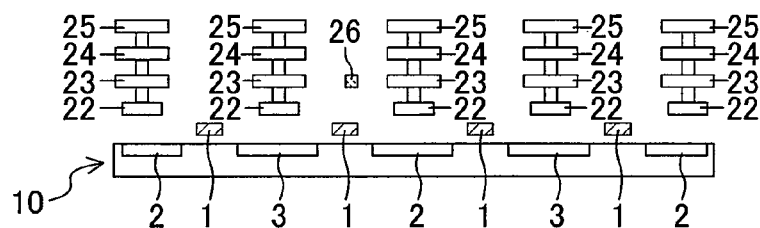
Figure 3C:
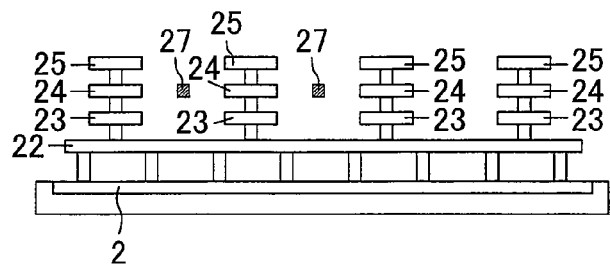

FIGS. 3A to 3C illustrate the structure of an ESD protection circuit in a semiconductor integrated circuit according to Embodiment 3 of the present invention. FIG. 3A is a plan view, FIG. 3B is a sectional view taken along the line a-a' and FIG. 3C is a section taken along the line b-b'. The structure shown in FIGS. 3A to 3C includes the same ESD protection circuit 10 as that shown in FIG. 1.

In FIGS. 3A to 3C, reference numerals 22, 23, 24 and 25 denote connecting wires formed above the ESD protection circuit 10 and connected to the ESD protection circuit 10. The connecting wires 22, 23, 24 and 25 are formed in first, second, third and fourth metal layers, respectively. Reference numerals 26 and 27 denote signal wires arranged to run above the ESD protection circuit 10.

Each of the connecting wires 23, 24 and 25 formed in the wiring layers is in the form of an array including a plurality of wire segments arranged at intervals in an array pattern. In FIGS. 3A to 3C, the array includes 4 wire segments aligned in the x direction and 5 wire segments aligned in the y direction. In each of the wiring layers including the array-shaped connecting wire, wires of other kinds are able to extend between the wire segments in the x and y directions. The signal wire 26 is formed in the second metal layer serving as a first wiring layer and extends in the x direction. The signal wire 27 is formed in the third metal layer serving as a second wiring layer and extends in the y direction.

In this way, since the connecting wire is in the form of an array including a plurality of wire segments arranged at intervals in an array pattern, the signal wires may be arranged to run above the ESD protection circuit without any hindrance by the connecting wires. Further, the extending direction of the signal wires is not limited only to one of the longitudinal and lateral directions. That is, in the wiring layer in which the array-shaped connecting wire has been formed, the signal wires are able to extend in both of the lateral and longitudinal directions above the ESD protection circuit. This makes it possible to use the space above the ESD protection circuit as a signal wire region with efficiency. Therefore, the congestion of the signal wires around the ESD protection circuit is prevented.

According to Embodiments 1 to 3 described above, the signal wire is arranged above the ESD protection circuit to extend across it. However, for example, the signal wire may be arranged above the ESD protection circuit to extend only to the middle of the ESD protection circuit.

Embodiment 4

Figure 4A:
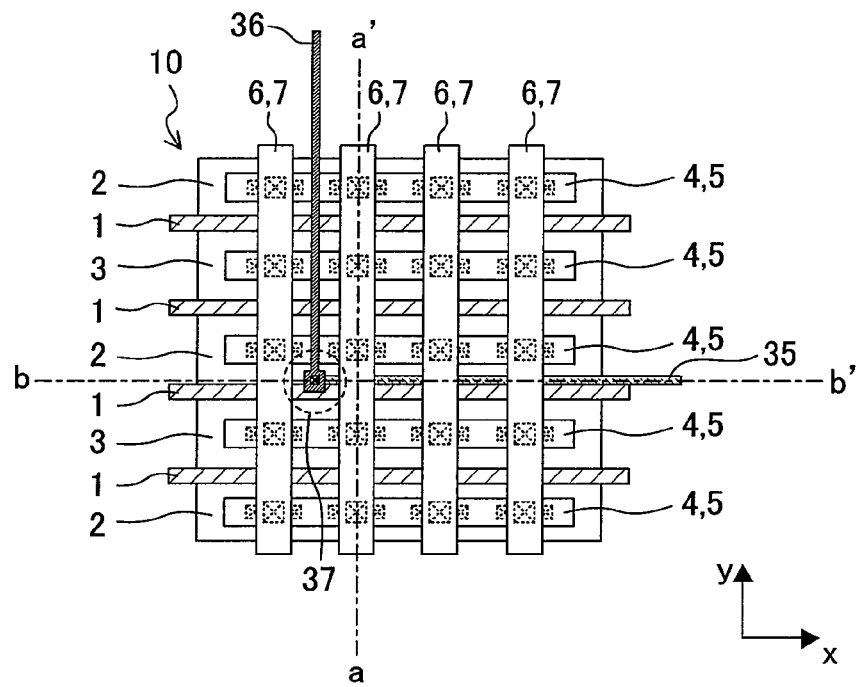
FIGS. 4A to 4C are views illustrating the structure of an ESD protection circuit in a semiconductor integrated circuit according to Embodiment 4 of the present invention.
Figure 4B:
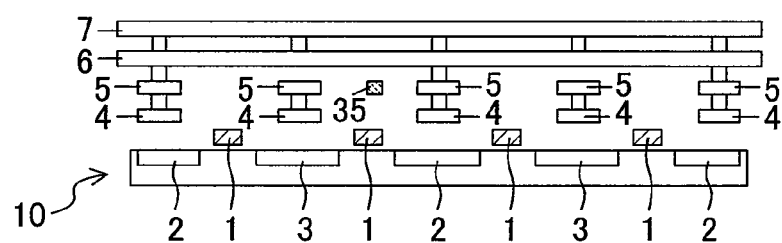
Figure 4C:
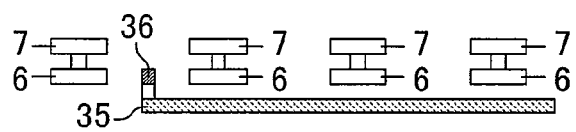

FIGS. 4A to 4C illustrate the structure of an ESD protection circuit in a semiconductor integrated circuit according to Embodiment 4 of the present invention. FIG. 4A is a plan view, FIG. 4B is a sectional view taken along the line a-a' and FIG. 4C is a sectional view taken along the line b-b'. The structure shown in FIGS. 4A to 4C includes the same ESD protection circuit 10 and the same connecting wires 4, 5, 6 and 7 as those shown in FIG. 1.

Reference numerals 35 and 36 denote signal wires arranged to run above the ESD protection circuit 10. The signal wire 35 is formed in a second metal layer and extends in the x direction in the same manner as the connecting wire 5. The signal wire 36 is formed in a third metal layer and extends in the y direction in the same manner as the connecting wire 6. The signal wires 35 and 36 are connected to each other at a point 37. That is, the signal wires are connected above the ESD protection circuit 10 to become a signal wire running across the wiring layers.

As the signal wire is routed across the wiring layers above the ESD protection circuit, the signal wire layout is defined with a higher degree of freedom. This makes it possible to prevent the congestion of the signal wires around the ESD protection circuit with more efficiency.

The present embodiment is achieved in combination with the structure of the connecting wires explained in Embodiment 1. However, the present invention is not limited thereto. In combination with the structures of the connecting wires of Embodiment 2 or 3, the signal wire may be routed across the wiring layers adjacent to each other in the stacking direction of the wiring layers in the same manner as in the present embodiment.

In each of the embodiments described above, the MOS protection circuit is taken as an example of the ESD protection circuit. However, the ESD protection circuit according to the present invention is not limited to the MOS protection circuit and the same effect as that explained above is also achieved on the ESD protection circuits of other kinds. Further, the number of wiring layers is not limited to that mentioned in the above-described embodiments.

Figure 5:
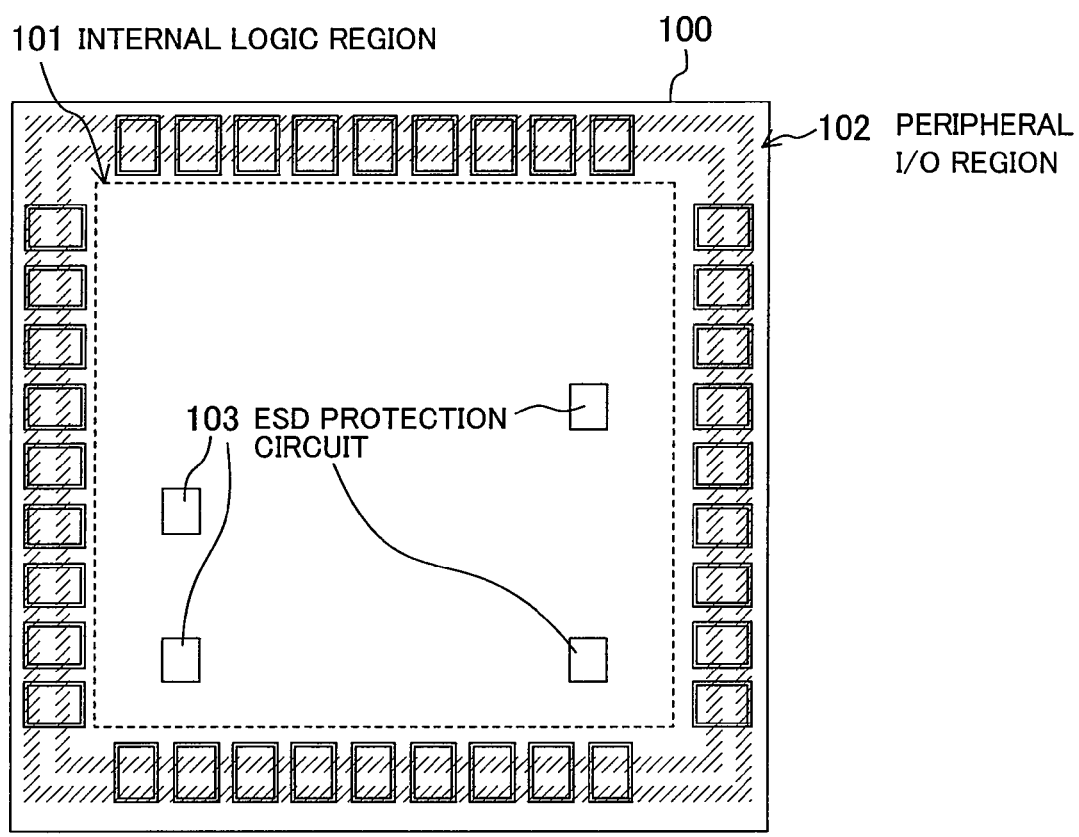
FIG. 5 is a view illustrating an example of a layout of the ESD protection circuit according to the present invention.

FIG. 5 shows an example of a layout of the ESD protection circuit of the present invention. In FIG. 5, a chip region of a semiconductor integrated circuit 100 is divided into an internal logic region 101 and a peripheral I/O region 102. The internal logic region 101 indicates a region other than the peripheral I/O region 102 of the chip region where a logic circuit and an analog circuit of the chip are formed. ESD protection circuits 103 according to the present invention are arranged in the internal logic region 101. As compared with the peripheral I/O region 102, signal exchange in the internal logic region 101 is more complicated and a larger number of signal wires are arranged therein at higher density. Therefore, the effect of the present invention is exhibited more significantly when the ESD protection circuits 103 of the present invention are arranged in the internal logic region 101.

Figure 6A:
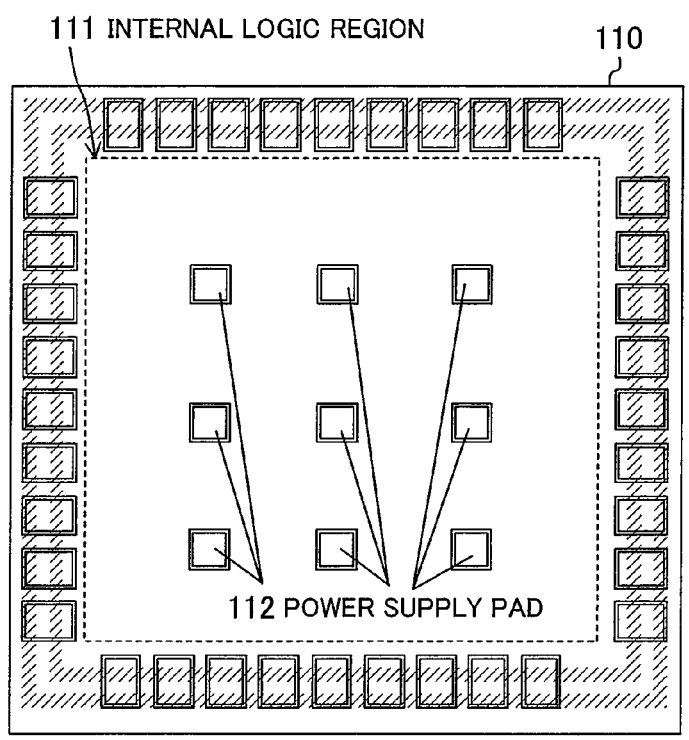
FIGS. 6A and 6B are views illustrating an example of a layout of power supply pads.
Figure 6B:
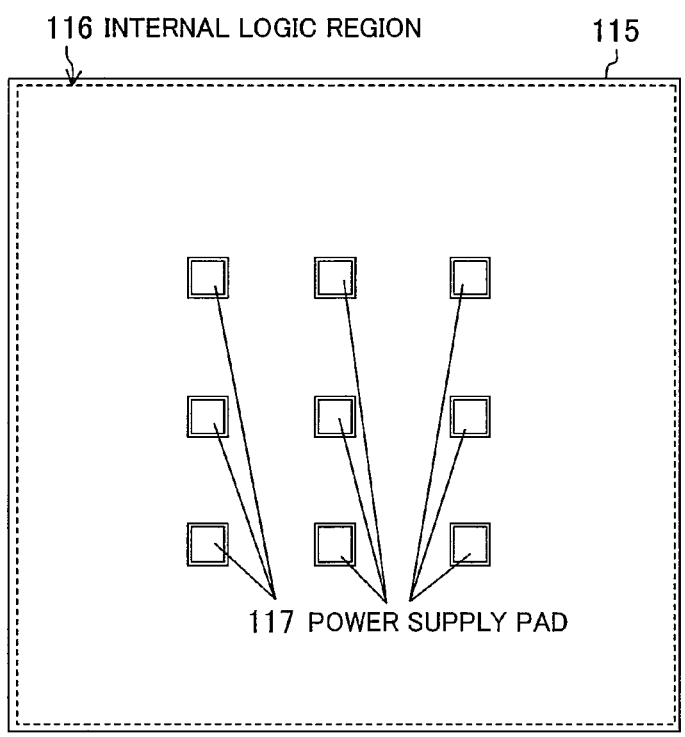

When power supply pads 112 are arranged in an internal logic region 111 of a semiconductor integrated circuit 110 as shown in FIG. 6A, ESD protection circuits corresponding to the power supply pads are preferably arranged near the power supply pads 112, or immediately below them if possible, to reduce discharge resistance during discharge of the ESD protection circuit. The power supply pads 112 are generally arranged near internal circuits that require enhanced power supply. Since a large number of signal wires are arranged at high density in these positions, the present invention exhibits more significant effect when it is applied to the ESD protection circuit. Further, in a semiconductor integrated circuit 115 not provided with the I/O regions on the periphery of the chip as shown in FIG. 6B, the present invention exhibits greater effect when it is applied to the ESD protection circuits arranged near the power supply pads 117. In the structure shown in FIG. 6B, the internal logic region 116 indicates the whole chip area because the I/O regions do not exist on the chip periphery.

Figure 7A:
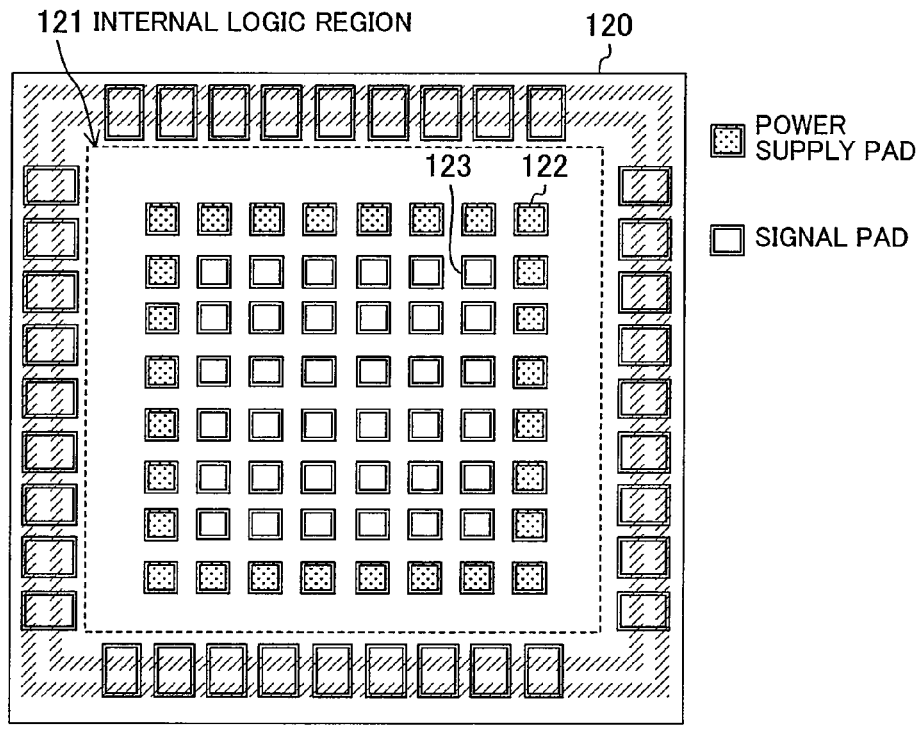
FIGS. 7A to 7B are views illustrating an example of a layout of signal pads.
Figure 7B:
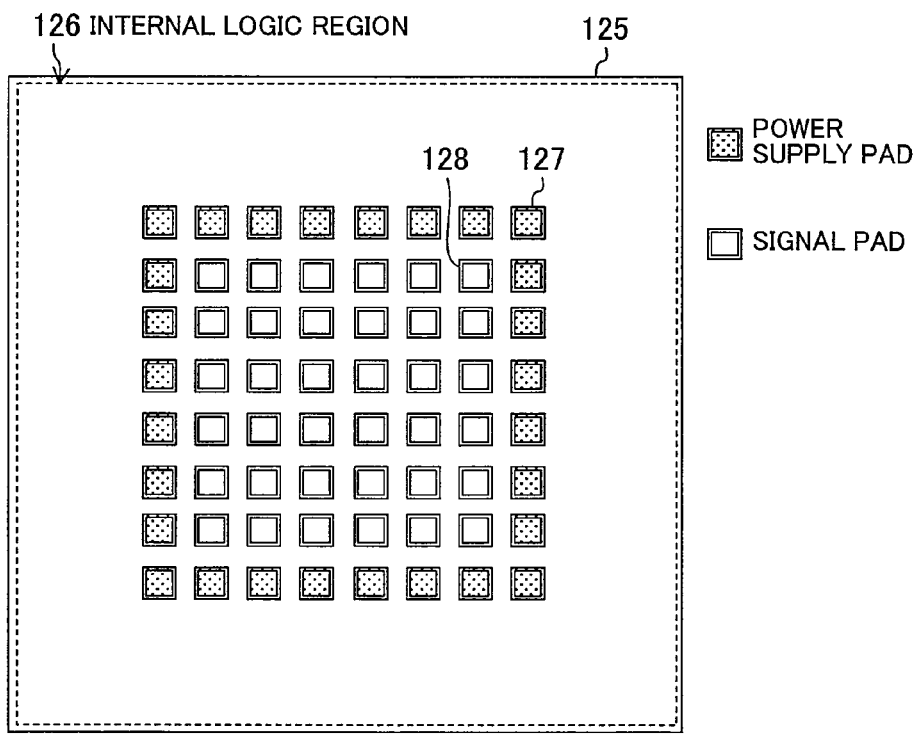
Figure 8A:
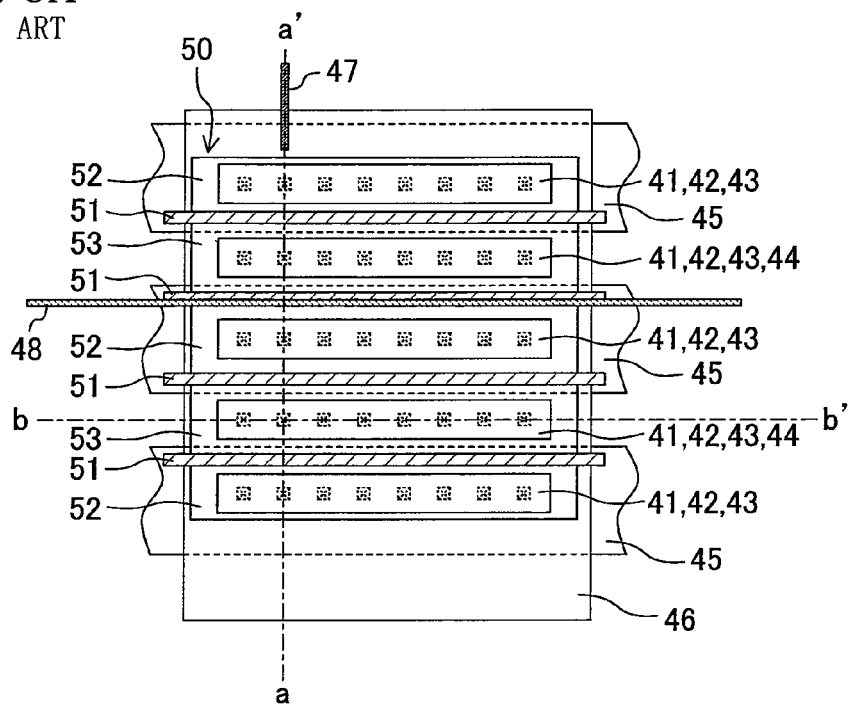
FIGS. 8A to 8C are views illustrating a conventional ESD protection circuit.
Figure 8B:
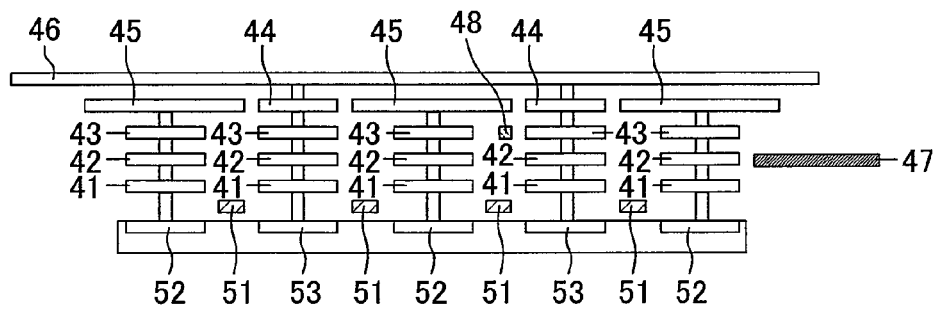
Figure 8C:
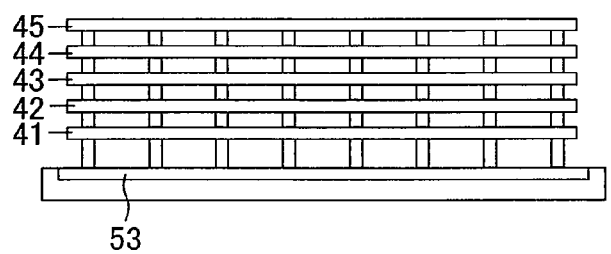
Figure 9:
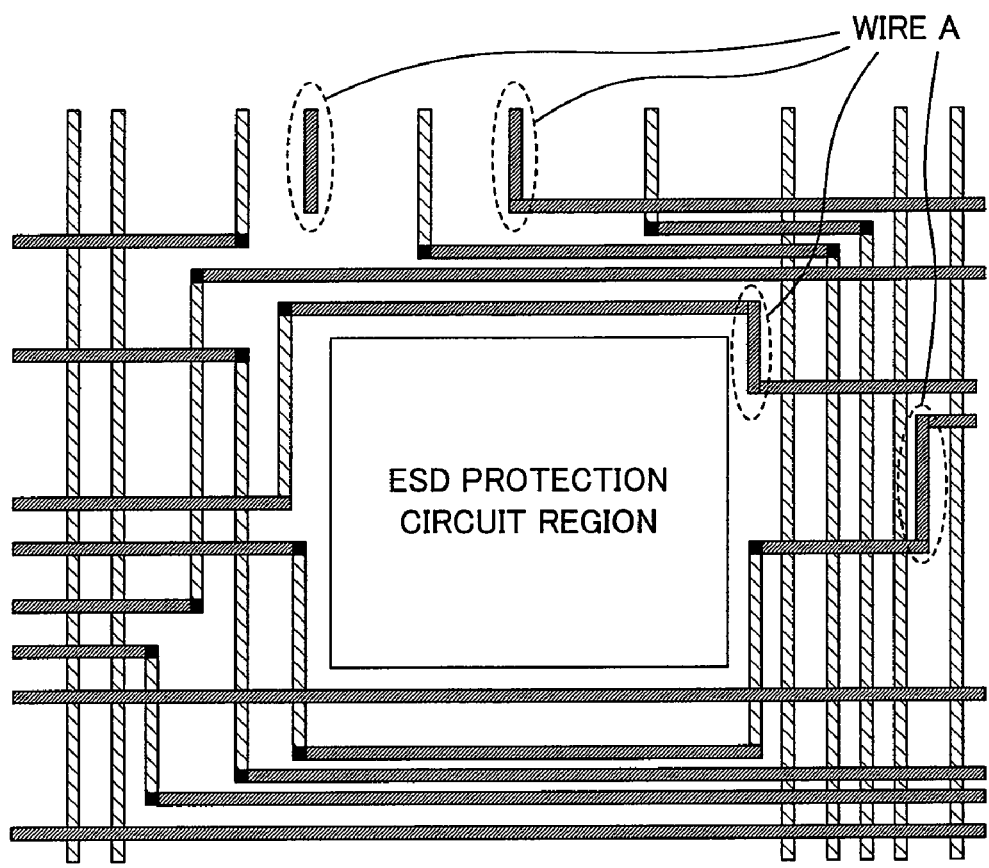
FIG. 9 is a view illustrating signal wires congested around an ESD protection circuit.

When signal pads 123 for signal input or output are formed in an internal logic region 121 of a semiconductor integrated circuit 120 as shown in FIG. 7A, the present invention may be applied to ESD protection circuits arranged near the signal pads 123. In this case, more than one signal terminals are provided for a single power supply pair in general. Therefore, as compared with the case where the present invention is applied to the ESD protection circuits associated with the power supply pads 122, the effect of the present invention is exhibited more significantly. It is needless to say that the present invention is also applicable to the ESD protection circuits arranged near the power supply pads 122. With respect to a semiconductor integrated circuit 125 shown in FIG. 7B in which the I/O regions are not provided on the periphery of the chip, the present invention exhibits more significant effect when it is applied to the ESD protection circuits arranged near the signal pads 128. As a matter of course, the present invention is also applicable to the ESD protection circuits arranged near the power supply pads 127. In the structure shown in FIG. 7B, the internal logic region 126 indicates the whole chip area because the I/O regions do not exist on the chip periphery.

As described above, the present invention makes it possible to reduce the congestion of the signal wires around the ESD protection circuit. Therefore, for example, the present invention is effective for improvement of signal characteristics and reduction of a chip area in the semiconductor integrated circuits.

What is claimed is:

1. A semiconductor integrated circuit comprising:
   an ESD protection circuit;
   a plurality of connecting wires formed above the ESD protection circuit and connected to the ESD protection circuit; and
   a signal wire passing through above the ESD protection circuit, wherein
   the connecting wires include a wire formed in a first wiring layer and extending in a first direction and a wire formed in a second wiring layer and extending in a second direction perpendicular to the first direction when viewed from the top, and
   the first wiring layer has a first region where the signal wire is capable of passing through above the ESD protection circuit in the first direction, and the second wiring layer has a second region where the signal wire is capable of passing through above the ESD protection circuit in the second direction.

2. The semiconductor integrated circuit of claim 1, wherein the signal wire is formed at the first region in the first wiring layer and passes through above the ESD protection circuit in the first direction.

3. The semiconductor integrated circuit of claim 1, wherein the signal wire is formed at the second region in the second wiring layer and passes through above the ESD protection circuit in the second direction.

4. The semiconductor integrated circuit of claim 1, wherein
   the signal wire comprises a first signal wire and a second signal wire,
   the first signal wire is formed at the first region in the first wiring layer and runs above the ESD protection circuit in the first direction,
   the second signal wire is formed at the second region in the second wiring layer and runs above the ESD protection circuit in the second direction, and
   the first signal wire is connected to the second signal wire above the ESD protection circuit.

5. The semiconductor integrated circuit of claim 1, wherein the second wiring layer is above the first wiring layer.

6. The semiconductor integrated circuit of claim 1, wherein the first wiring layer and the second wiring layer are adjacent to each other in a stacking direction of the wiring layers.

7. The semiconductor integrated circuit of claim 1, wherein the ESD protection circuit is arranged in an internal logic region.

8. The semiconductor integrated circuit of claim 7, wherein
   a power supply pad is provided on the internal logic region and
   the ESD protection circuit is arranged near the power supply pad.

9. The semiconductor integrated circuit of claim 7, wherein
   a signal pad is provided on the internal logic region and
   the ESD protection circuit is arranged near the signal pad.

10. A semiconductor integrated circuit comprising:
    an ESD protection circuit;
    a plurality of connecting wires formed above the ESD protection circuit and connected to the ESD protection circuit; and
    a signal wire passing through above the ESD protection circuit, wherein
    the connecting wires include a wire formed in a first wiring layer and extending in a first direction and a wire formed in a second wiring layer and being in the form of an array including a plurality of wire segments arranged at intervals in an array pattern, and
    the first wiring layer has a first region where the signal wire is capable of passing through above the ESD protection circuit in the first direction, and the second wiring layer has a second region where the signal wire is capable of passing through above the ESD protection circuit in a second direction perpendicular to the first direction when viewed from the top.

11. The semiconductor integrated circuit of claim 10, wherein the second wiring layer has a third region where the signal wire is capable of passing through above the ESD protection circuit in the first direction.

12. The semiconductor integrated circuit of claim 10, wherein the signal wire is formed at the first region in the first wiring layer and passes through above the ESD protection circuit in the first direction.

13. The semiconductor integrated circuit of claim 10, wherein the signal wire is formed at the second region in the second wiring layer and passes through above the ESD protection circuit in the second direction.

14. The semiconductor integrated circuit of claim 10, wherein
    the signal wire comprises a first signal wire and a second signal wire,
    the first signal wire is formed at the first region in the first wiring layer and runs above the ESD protection circuit in the first direction,
    the second signal wire is formed at the second region in the second wiring layer and runs above the ESD protection circuit in the second direction, and
    the first signal wire is connected to the second signal wire above the ESD protection circuit.

15. The semiconductor integrated circuit of claim 10, wherein the second wiring layer is above the first wiring layer.

16. The semiconductor integrated circuit of claim 10, wherein the first wiring layer and the second wiring layer are adjacent to each other in a stacking direction of the wiring layers.

17. The semiconductor integrated circuit of claim 10, wherein the ESD protection circuit is arranged in an internal logic region.

18. The semiconductor integrated circuit of claim 17, wherein
 a power supply pad is provided on the internal logic region and
 the ESD protection circuit is arranged near the power supply pad.

19. The semiconductor integrated circuit of claim 17, wherein
 a signal pad is provided on the internal logic region and
 the ESD protection circuit is arranged near the signal pad.

\* \* \* \* \*